United States Patent [19]

Pesavento

[11] Patent Number: 4,695,733

[45] Date of Patent: Sep. 22, 1987

[54] PHOTOCONDUCTIVE POWER SWITCH

[76] Inventor: Philip Pesavento, 1622 6th St., Manhattan Beach, Calif. 90266

[21] Appl. No.: 661,938

[22] Filed: Oct. 17, 1984

[51] Int. Cl.[4] .......................... H03K 3/42; H01L 27/14
[52] U.S. Cl. ....................................... 250/551; 357/30; 307/311; 250/211 J
[58] Field of Search ................. 250/551, 211 J, 211 R; 357/30; 307/311

[56] References Cited

U.S. PATENT DOCUMENTS

| | | | |
|---|---|---|---|
| 3,917,943 | 11/1975 | Auston | 357/30 |
| 4,376,285 | 3/1983 | Leonberger et al. | 357/30 |
| 4,438,331 | 3/1984 | Davis | 250/211 J |
| 4,490,709 | 12/1984 | Hammond et al. | 357/30 |
| 4,494,132 | 1/1985 | Kohn | 250/211 J |

OTHER PUBLICATIONS

L. R. Lowry and D. J. Page, "Light Activated Semiconductor Switches", Proceedings of the IEEE 1977 N.A.E.C.O.N. Conference, May 17–19, 1977, pp. 615–622.
"Phased Array Diode Lasers," *Laser Focus/Electro-Optics*, by W. Streifer, R. D. Burnham, T. L. Paoli, and D. R. Scifres, Jun., 1984, p. 100.
"High Power Coupled Multiple Stripe Quantum Well Injection Lasers," by D. R. Scifres, R. D. Burnham, and W. Streifer, *Appl. Phys. Lett.* 41(2), Jul. 15, 1982, p. 118.
Advertisement: Spectra Diode Laboratories, Inc., 2/84.
"Picosecond Hi-Power Switching and Applications," by G. Mourou, W. Knox and S. Williamson, *Laser Focus*, Apr., 1982, p. 97.
"High-speed InP optoelectronic switch," by F. J. Leonberger and P. F. Moulton, *Appl. Phys. Lett.* 35(9), Nov. 1, 1979, p. 712.
"Photoconductive Power Switches," by W. C. Nunnally, R. B. Hammond, for the Electronics Division, Los Alamos National Laboratory, Los Alamos, N. Mex.
"Signal Processing Using Photoconductor Gates," H. J. Whitehouse, W. H. McKnight, for Naval Ocean Systems Center, San Diego, Calif.
"Piocosecond Optical Electronics for High-Speed Instrumentation," D. H. Auston and P. R. Smith, *Laser Focus*, Apr. 1982, p. 89.
"Picosecond optoelectronics in high-speed integrated circuits," R. K. Jain, K. Stenersen, D. E. Snyder, for Optical Physics Department, Hughes Research Laboratories, Malibu, Calif.
"Picosecond photoconductive switching in semiconducting and insulating natural diamond," H. M. van Driel, R. F. Code, D. J. Moss and P. K. Bharadwaj, Department of Physics and Erindale College, University of Toronto, Canada.
"Silicon Switch Development for Optical Pulse Generation in Fusion Lasers at Lawrence Livermore National Laboratory," Russell B. Wilcox, for Laser Program, Lawrence Livermore National Laboratory, Livermore, Calif.
"InP optoelectronic switches and their high-speed signal-processing applications," C. H. Cox, III, V. Diadiuk, I. Yao, F. J. Leonberger and R. C. Williamson, for Lincoln Laboratory, Massachusetts Institute of Technology, Lexington, Mass., 1983.
"Picosecond InP optoelectronic switches," A. G. Foyt, F. J. Leonberger and R. C..Williamson, Lincoln Laboratory, Massachusetts Institute of Technology, Lexington, Mass., 1982.

Primary Examiner—Edward P. Westin
Assistant Examiner—Charles Wieland
Attorney, Agent, or Firm—Christie, Parker & Hale

[57] ABSTRACT

A photoconductive power switch capable of producing electrical pulses of at least 10 amperes and 100 volts at switching speeds of one nanosecond or less is disclosed. The photoconductive power switch comprises a wafer of high resistivity semiconductor material selected from Group III and Group V compounds, preferably indium phosphide. A pair of electrodes are mounted on the wafer and are spaced apart to form a gap. A diode laser is provided for illuminating the gap with light having a wavelength of from about 200 to about 850 nanometers at an intensity of at least 50 picojoules.

7 Claims, 2 Drawing Figures

PHOTOCONDUCTIVE POWER SWITCH

FIELD OF THE INVENTION

This invention relates to photoconductive switches and more particularly to a high speed photoconductive power switch utilizing a diode laser to activate the switch.

BACKGROUND OF THE INVENTION

Photoconductive switches are devices which produce electrical pulses in response to illumination by a light source, typically a laser. Such switches comprise a pair of spaced-apart electrically conductive electrodes which are mounted on a photoconductor, e.g., a high resistivity semiconductor. A bias voltage is applied across the electrodes and, when the photoconductor is illuminated, current is passed between the electrodes.

The photoconductor is illuminated with light having an energy greater than the band gap of the photoconductor, which is the energy needed to raise electrons from the valence band to the conduction band, i.e., from a non-conductive and high resistance state to a conductive or low resistance state of the photoconductor.

When uniformly illuminated, the conductivity of the entire photoconductor can be changed in the time in which optical energy is delivered. The light generates electron-hole pairs in the photoconductor. This generation of electron-hole pairs increases the conductivity of the photoconductor, allowing current to flow. The electron-hole pairs are rapidly removed by recombining in the photoconductor material. With these materials, when the optical energy is shut off, the current is immediately terminated. This rapid recombination is known as a short excess carrier lifetime.

In other photoconductor materials, e.g., silicon, the electron-hole pairs do not readily recombine in the photoconductor material. With these materials, e.g., silicon, the current shuts off much more gradually when the optical energy is terminated. Gradual recombination is known as a long excess carrier lifetime. Long excess carrier lifetimes result in slow switching speeds. With some of these materials, a second light source can be used to cause conduction of the electron-holes to a third grounding electrode in the photoconductor material and thus, to obtain high switch speeds.

The operating voltage and current of the photoconductive switches is dependent on the intensity of the illumination from the light source. For power switching applications, i.e., applications requiring voltages of at least 100 volts and currents of at least 10 amperes, the intensity of the light on the photoconductor must be at least 50 picojoules. Solid state, gas, and dye lasers are used to deliver light at such an intensity. Such light sources, however, tend to be bulky and expensive which make the power switches bulky and expensive.

SUMMARY OF THE INVENTION

The present invention provides a high speed photoconductive power switch capable of producing electrical impulses of at least 10 amperes and 100 volts at switching speeds of up to 1 nanosecond or less.

The photoconductive power switch comprises a wafer of high resistivity semiconductor material selected from the group consisting of Group III and Group V compounds including indium phosphide and gallium arsenide. A pair of electrically conductive electrodes are mounted on the wafer. The electrodes are separated by a gap having a select length and width. The power switch further comprises a diode laser which produces light having an energy at least as great as the band gap of the semiconductor material and capable of illuminating the gap with light at a light intensity of at least 50 picojoules.

Illumination of the gap by the laser diode causes the resistivity of the semiconductor to drop sufficiently to allow current to flow through the semiconductor, thereby activating the switch.

BRIEF DESCRIPTION OF THE DRAWINGS

These and other features and advantages of the present invention will be better understood by reference to the following detailed description when considered in conjunction with the accompanying drawings wherein.

DETAILED DESCRIPTION

Figure 1:
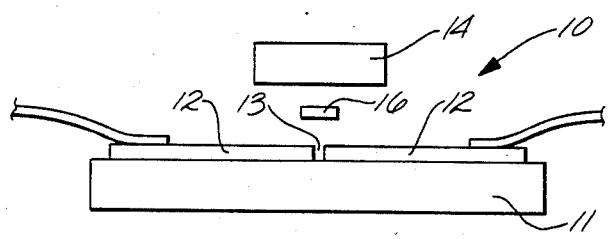
FIG. 1 is a schematic view of a preferred embodiment of a photoconductive switch according to the present invention.

With reference to FIG. 1, there is shown schematically a preferred photoconductive power switch capable of producing electrical impulses of at least 10 amperes and 100 volts at switching speeds, i.e., the time at which the switch can make a transition from a high resistivity state to a low resistivity state, as fast as one nanosecond or faster. The switch 10 comprises a photoconductive wafer 11, a pair of electrodes 12 and a diode laser 14.

The wafer 11 is made of high resistivity semiconductor material selected from the group consisting of Group III and Group V compounds. Such materials include indium phosphide, gallium arsenide, carbon, potassium polyphosphide and silicon carbide. Indium phosphide is presently preferred. These materials have a band gap in the infrared and hence become conductive, i.e., generate electron-hole pairs, when illuminated with light in the infrared. When the light is shut off, the electron-hole pairs rapidly recombine in the semiconductor material. Such materials are capable of rapid switching speeds of less than one nanosecond without the need of a second light source to "shut off" the switch. Indium phosphide is presently preferred.

A pair of electrically conductive electrodes 12 are mounted or deposited onto the wafer 11 and are spaced apart to form a gap 13. The length of the gap 13, i.e., the distance between electrodes, is determined by the desired operating voltage. The width of the gap 15, i.e., the distance across each electrode, is determined by the operating current. A gap length of approximately 0.001 inch and a gap width of 0.1 inch is presently preferred for operating at a current of about 10 amperes and a voltage of about 100 volts.

The electrodes 12 may be any conductive material that can be mounted or deposited, e.g., evaporated, epoxied, sputtered, electroplated, electroless plated, plasma sprayed, brazed, soldered, or welded, onto the semiconductor wafer. Electrodes of gold-germanium alloy are presently preferred. Such an electrode material can be deposited onto the semiconductor wafer by evaporation and is then sintered to form an ohmic contact with the wafer.

A diode laser 14 is mounted at a position spaced apart from the gap and oriented to illuminate the gap. Coupling optics 16 are provided to focus the light from the diode laser 14 onto the gap 13. The intensity of the illumination from the diode laser on the gap is sufficient to generate sufficient conductivity in the semiconductor to achieve efficient switching. The light intensity at the gap is preferably at least 50 picojoules. While it is preferred that the entire gap be illuminated, illumination of only a portion of the gap is sufficient as long as the area is large enough to activate the switch.

The energy or wavelength of the light from the diode laser must be at least equal to the band gap of the semiconductor material to create electron-hole pairs. Light having an energy less than the band gap will only increase the thermal energy of the semiconductor without lowering its resistivity. Since the band gaps for indium phosphide and gallium arsenide are in the infrared region of the spectrum, the wavelength of the diode laser light is preferably in the range of from about 200 to about 850 nm.

Diode lasers capable of producing light having an energy greater than the band gap of indium phosphide or gallium arsenide in an intensity sufficient to provide at least 50 picojoules of light at the gap are described, for example, by Scifres et al in *Appl. Phys. Lett., Vol.* 41, No. 2 at page 118 (1982) which is incorporated herein by reference. Such diode lasers utilize a coupled multiple stripe well injected laser array construction. A presently preferred multiple stripe diode laser is manufactured by Spectra Diode Laboratories, Inc. and sold under the designation SDL-2410. Such a diode laser has a wavelength of about 810 nanometers.

Compared with conventional solid state or gas lasers, diode lasers are compact and inexpensive. This invention then, offers the unique advantage of an inexpensive power switch with switching speeds as fast as one nanosecond or less. Such a power switch could easily fit into a three inch cube housing.

Such high speed photoconductive power switches have numerous applications. For example, such power switches could replace other types of power switches used by electrical utilities for substation control, motor controllers, electric vehicles, lasers, home appliances, computer power supplies and power supplies of all types, inverters for solar photovoltaic converters and constant frequency converters for wind turbine generators. Such switches can be used to switch AC to DC, DC to DC, DC to AC and AC to AC. They can be used to replace thyristors, SCR's, power tubes, bipolar and FET power transistors in any amplifier or switching applications from DC to microwaves.

The preceding description has been presented with reference to the presently preferred embodiment of the invention shown in the accompanying drawing. Workers skilled in the art and technology to which this invention pertains will appreciate that alterations and changes in the described apparatus and structure can be practiced without meaningfully departing from the principles, spirit and scope of this invention.

Figure 2:
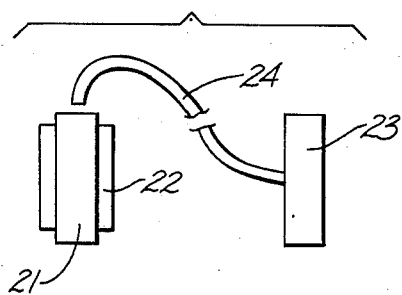
FIG. 2 is a schematic view of a second preferred embodiment of a photoconductive switch according to the present invention.

For example, it is apparent that the shape of the wafer gap and electrodes may vary. FIG. 2, illustrates a photoconductive switch according to the invention wherein the wafer 21 is a parallelepiped in which electrodes 22 are attached on opposite sides of the parallelepiped, wafer or chip.

In this embodiment of the invention, the light from the diode laser 23 is delivered through an optical fiber 24. This enables a further reduction in the size of the photoconductive switch by mounting the diode laser away from the photoconductive wafer 21 at a more convenient location. It is apparent that, if sufficient illumination is delivered to the gap, coupling optics need not be used.

Accordingly, the foregoing description should not be read as pertaining only to the precise structures described, but rather should be read consistent with and as support for the following claims which are to have their fullest fair scope.

What is claimed is:

1. A method for producing an electrical pulse of at least about 10 amperes and about 100 volts at a switching speed of about one nanosecond or less comprising:
   providing a photoconductive switch comprising:
      non-cryogenically cooled wafer of high resistivity semiconductor material capable of transistion between a high resistivity state and a low resistivity state in about one nanosecond or less selected from the group consisting of compounds containing elements from Group III to Group V, carbon, silicon carbide and mixtures thereof;
      a pair of electrodes mounted on the wafer, said electrodes being spaced apart to form a gap;
      a high powered multiple stripe diode laser capable of emitting light having an energy at least as great as the band gap of the semiconductor material at an intensity of at least 50 picojoules; and
      means for directing light emitted from the diode laser onto the gap;
   applying a bias voltage of at least about 100 v across the gap; and
   activating the diode laser to thereby generate an electrical pulse of at least about 10 amperes and about 100 volts.

2. A method as claimed in claim 1 wherein the semiconductor material is selected from the group consisting of indium phosphide, gallium arsenide, carbon, potassium phophosphide and silicon carbide.

3. A method as claimed in claim 2 wherein the semiconductor material is indium phosphide.

4. A method as claimed in claim 1 wherein the means for directing light emitted from the diode laser onto the gap comprises an optic fiber for receiving light from the diode laser and coupling optics for receiving light from the optic fiber and for focusing the light onto the gap.

5. A method as claimed in claim 1 wherein the light from the diode laser has a wavelength in the range of from about 200 to about 850 nanometers.

6. A method as claimed in claim 1 wherein the electrodes comprise gold-germanium alloy.

7. A method as claimed in claim 6 wherein the electrodes form an ohmic contact with the wafer.

* * * * *